United States Patent [19]

Mathisen et al.

[11] 3,796,497

[45] Mar. 12, 1974

[54] OPTICAL ALIGNMENT METHOD AND APPARATUS

[75] Inventors: Einar S. Mathisen; Robert L. Moore, both of Poughkeepsie; Leonard S. Sheiner, Wappingers Falls, all of N.Y.

[73] Assignee: International Business Machines Corporation, Armonk, N.Y.

[22] Filed: Dec. 1, 1971

[21] Appl. No.: 203,736

[52] U.S. Cl. .................. 356/152, 356/172, 250/201, 250/219 DR, 29/587

[51] Int. Cl. ............................................ G01b 11/26

[58] Field of Search .............. 29/578; 356/152, 172; 250/201, 219 DR

[56] References Cited

UNITED STATES PATENTS

| | | | |
|---|---|---|---|
| 3,683,195 | 8/1972 | Johannsmeier | 250/219 DR |
| 3,539,260 | 11/1970 | Burch | 350/162 SF |
| 3,497,705 | 2/1970 | Adler | 250/201 |
| 3,612,698 | 10/1971 | Mathisen | 356/141 |
| 3,461,566 | 8/1969 | Gerstner | 33/228 |
| 3,535,527 | 10/1970 | Beall, Jr. | 356/181 |

FOREIGN PATENTS OR APPLICATIONS

| | | | |
|---|---|---|---|
| 1,218,856 | 1/1971 | Great Britain | 29/587 |

OTHER PUBLICATIONS

Sheiner, "Wafer Alignment for Resist Exposure," Photo Tech Conference, 6–1968

*Primary Examiner*—Maynard R. Wilbur
*Assistant Examiner*—S. C. Buczinski
*Attorney, Agent, or Firm*—David M. Bunnell

[57] ABSTRACT

An electro-optical mask and wafer alignment system employs alignment patterns on the mask and wafer whose images can be selectively passed through a spatial filter. Each pattern comprises at least two nonparallel lines. The alignment pattern configuration permits the X, Y coordinate locations of at least two corresponding points on the mask and wafer to be sensed by scanning the filtered images of the alignment patterns past a sensing device in a single direction. The mask and/or wafer are then positioned such that the signals generated from the alignment patterns indicate that the corresponding points on the mask and wafer are aligned.

10 Claims, 11 Drawing Figures

INVENTORS
EINAR S. MATHISEN
ROBERT L. MOORE
LEONARD S. SHEINER
BY David M. Bunnell
ATTORNEY

OPTICAL ALIGNMENT METHOD AND APPARATUS

BACKGROUND OF THE INVENTION

This invention relates generally to electro-optical devices and more particularly to a system for repeatably positioning objects in a particular orientation with respect to one another.

The fine alignment of two or more objects frequently becomes necessary in semi-automatic or automatic manufacturing systems. For example, in the manufacture of semiconductor devices it is necessary to align a piece of semiconductor material with a series of exposure masks to permit various portions of the devices to be formed in sequence. Because of the small dimensions and high density of the devices formed in the semiconductor it is necessary that each subsequent alignment be accurate within narrow tolerances or the devices will be inoperative. To accomplish the alignment, reference patterns are placed in spaced regions on the masks and semiconductor. For example, the first of a series of masks is used to place the reference patterns on the semiconductor material such as by etching. These patterns are then used to align the semiconductor material with corresponding reference patterns on each subsequent mask.

BRIEF SUMMARY OF THE INVENTION

The present invention is an alignment method and system which accomplishes the rapid, repeatable and automatic positioning of objects. Each object is provided with corresponding alignment patterns in at least two spaced apart regions. Each pattern comprises at least two non-parallel lines which permits the position of corresponding points on each object to be determined by optically scanning spatially filtered images of the patterns in a single direction to generate signals indicative of the position of the objects. The location and orientation of the objects is then adjusted, as necessary, until the signals indicate that the objects are aligned.

DESCRIPTION OF PREFERRED EMBODIMENTS

Figure 1:
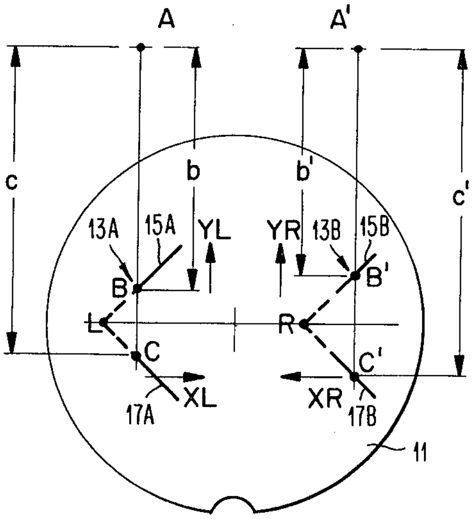
FIG. 1 is a plan view of a semiconductor wafer illustrating the geometry of the alignment method of the invention.
Figure 1A:
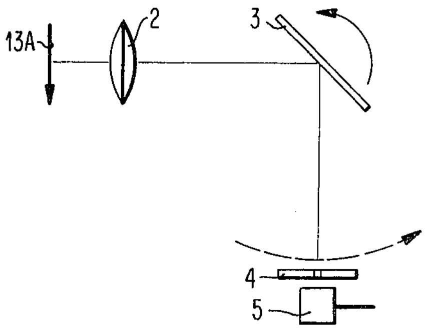
FIG. 1A is a schematic view illustrating an optical scanning system.

Turning now to FIG. 1, the geometry of the alignment method of the invention is illustrated. An object, for example, semiconductor wafer 11 is provided with two alignment patterns 13A and 13B in spaced regions on the wafer with the size of the patterns being greatly exaggerated for the purpose of illustration. Each pattern has at least two lines 15A, B and 17A, B whose poits of intersection L and R are used as reference points to align the wafer 11. To carry out the alignment, the images of patterns 13A and 13B are scanned past sensors at a constant rate in the manner shown in FIG. 1A. The object, such as patterns 13A, is imaged by lens 2 onto mirror 3. Mirror 3 is rotated at a constant speed which moves the image of the object in the direction of the arrow until the image crosses the slit 4. A light sensing device 5 produces signals as the image of object 1 crosses slit 4. For increased sensitivity multiple slits can be provided which are each oriented to be parallel to the images of the lines 15A and B and 17A and B.

The times when the images of lines 15A and 17A are scanned past the detector are recorded from an arbitrary time reference, $T_o$, which is suitably obtained in a conventional manner on each scan from the scanning device or control system. Because the images are scanned at a constant speed, the position of the object with respect to an arbitrary reference point is directly proportional to the recorded times. For example, the $Y_L$, cartesian coordinate, of point L on the left side of wafer 11, which point represents the intersection of lines 15A and 17A, is given by $$Y_L = V(T_B + T_C)/2$$

where $T_B$ = time from $T_o$ to point B on line 15A and $T_C$ = time from $T_o$ to point C on line 17A
$V$ = constant because the time $T_C - T_B$ between points B and C along the line of scan is indicative of the distance from L of the line of scan, then the $X_L$ cartesian coordinate point L is given by:

$$X_L = V(T_C - T_B)/2$$

Similarly, from the signals generated by scanning pattern 13B, the $X_R$ and $Y_R$ cartesian coordinates of point R on the right side of wafer 11, which point represents the intersection of lines 15B and 17B, are given by:

$$Y_R = V(T_{B'} + T_{C'})/2$$

and $$X_R = V(T_{C'} - T_{B'})/2$$

because points L and R represent points which are a fixed distance apart the X coordinate of the wafer 11 is the average of $X_L$ and $X_R$ $$X = (X_R + X_L)/2$$

and the three coordinates $X$, $Y_L$ and $Y_R$ then determine the X, Y and rotational orientations of the wafer.

The position of the second object is similarly determined and the relative position of the objects changed, conveniently by holding one fixed and moving the other, until the signals from the sensors indicate that the two corresponding reference points L and R are aligned. The position determinations can be done either in sequence or simultaneously as shown in simplified form in FIGS. 2A, B, C.

Figure 2A:
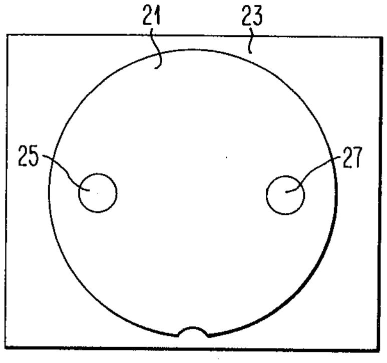
FIGS. 2A, B, C are plan views of a semiconductor wafer and mask illustrating the geometry of the alignment method of the invention.
Figure 2B:
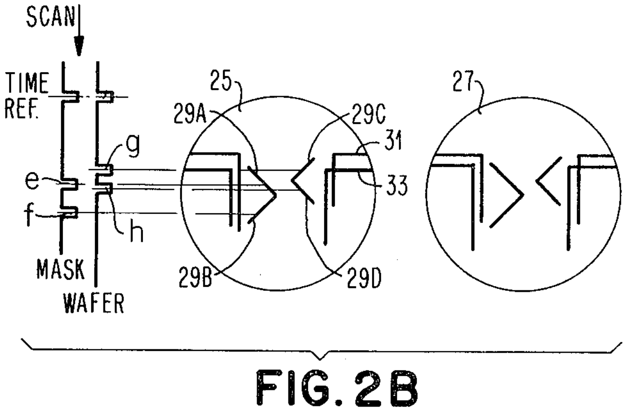
Figure 2C:
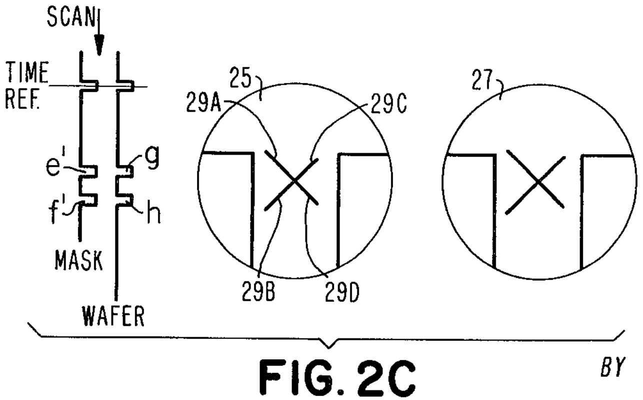

The images of wafer 21 and mask 23 are optically superimposed (FIG. 2A) and roughly aligned. Regions 25 and 27 containing the alignment patterns are scanned. The images of the lines 29A, B, on wafer 21, and lines 29C, D on mask 23 in region 25 are shown in FIGS. 2B with the device patterns 31 and 33 on wafer 21 and mask 23 respectively being slightly misaligned. The signals *e, f, g, h* generated by the images of the lines 29A, B, C, D do not match. The same is true for the lines of the second region 27. The location of the wafer 21 is then changed based on the information from the time signals *e, f, g, h* until the signals *e, f, g', h'* for region 25 match and signals similarly obtained for region 27 also match. The wafer 21 and mask 23 patterns are then correctly aligned (FIG. 2C).

The lines of each pattern shown in the preceding examples are at 90° with respect to each other and at 45° with respect to the device patterns. It should be understood that the selection of these angles is not critical and the angles for this example are chosen for convenience and illustration only. The angles of the lines with respect to the device patterns are chosen to permit optical filtering of the alignment patterns so that optical "noise" from the device patterns does not interfere with the signals from the alignment patterns. The angle of the lines with respect to one another is greater than 0° but less than 180° and is chosen to give the desired sensitivity. For example, nearly parallel lines are not desirable because they would give nearly the same signals for a relatively large change in position.

Figure 3:
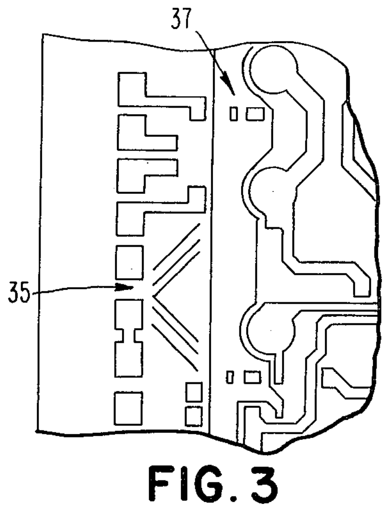
FIG. 3 is a plan view of a portion of a semiconductor wafer showing an alignment pattern.

Although single lines are adequate it is found preferable to employ groups of parallel lines with different spacings such as a herringbone or partial herringbone pattern. This results in a series of signals which by proper programming permits a computer to correctly recognize the alignment pattern position in spite of noise or possibly missing portions of the pattern. FIGS. 3 and 4C, for example, illustrate two suitable patterns 35 and 42 respectively which are located in the areas alongside the device patterns 37 and 44 respectively.

With respect to the spatial filtering aspect of the invention the invention utilizes a Fraunhofer diffraction pattern of the objects to be aligned which is substantially a Fourier transform of the pattern. The alignment pattern configuration is selected to enable a detector to produce signals characteristic of the location of the lines of the pattern while the "noise" resulting from the remainder of the image of the object is either completely filtered out or suppressed to the point where it does not interfere with the detector's ability to determine when the alignment pattern is sensed. This can be done even when, as in the case of a multi-step microminiaturized circuit production process, the alignment pattern may be buried below several passivating layers on a semiconductor wafer because of the image enhancement achieved by the spatial filtering technique.

Figure 4A:
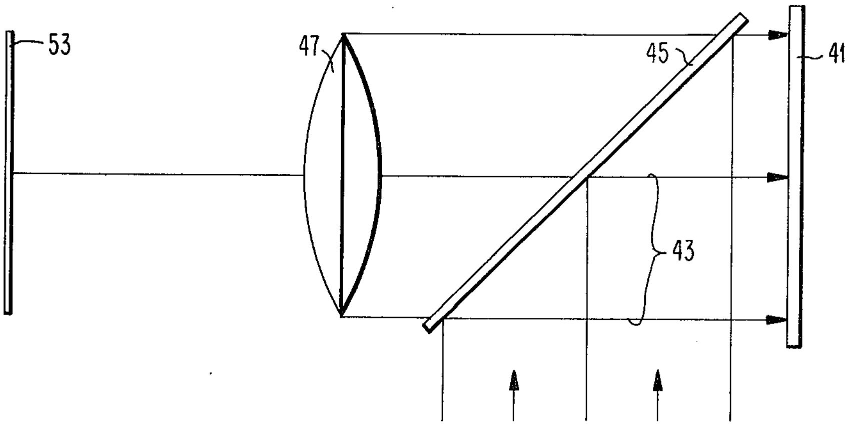
FIGS. 4A, B, C are schematic views of a system illustrating the generation of a Fraunhofer diffraction pattern.
Figure 4B:
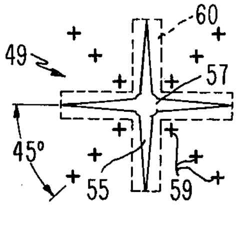
Figure 4C:
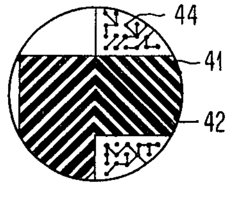

Turning now to FIGS. 4A to 4C the generation of a diffraction pattern is illustrated. An object 41 is illuminated with vertical collimated light 43 which is reflected onto the object by beam splitter 45. Lens 47, such as a microscope objective, images a Fraunhofer diffraction pattern 49 (FIG. 4B) which is substantially the Fourier transform of the patterns 42 and 44 (FIG. 4C) in its back focal plane 53. The large cross 55 in pattern 49 represents all the spatial frequencies of the X and Y lines representing the integrated circuit pattern on object 11. The smaller crosses 59 in each quadrant at an angle of 45° to cross 55 represent all the alignment lines on the wafer. Each smaller cross further from the center of the pattern 49 represents a finer line spacing, e.g., a higher spatial frequency.

The Fourier transform pattern shown is then filtered to pass only the spatial frequencies necessary to form a modified image of the alignment pattern. For example, an opaque material is placed at the back focal plane 53 so as to block the unwanted spatial frequencies acting as a band pass filter. A suitable filter would be a piece of glass with an opaque 90° cross 60. The filter can have other configurations such as for example a piece of opaque material which apertures cut out to let the spatial frequencies of the alignment pattern pass through. An advantage of the invention is that the alignment target can be positioned close to the active integrated circuit patterns. It should also be understood that when aligning transparent or semitransparent objects the image of the patterns can be constructed by transmission of light through the objects rather than reflection from the surface.

Figure 5:
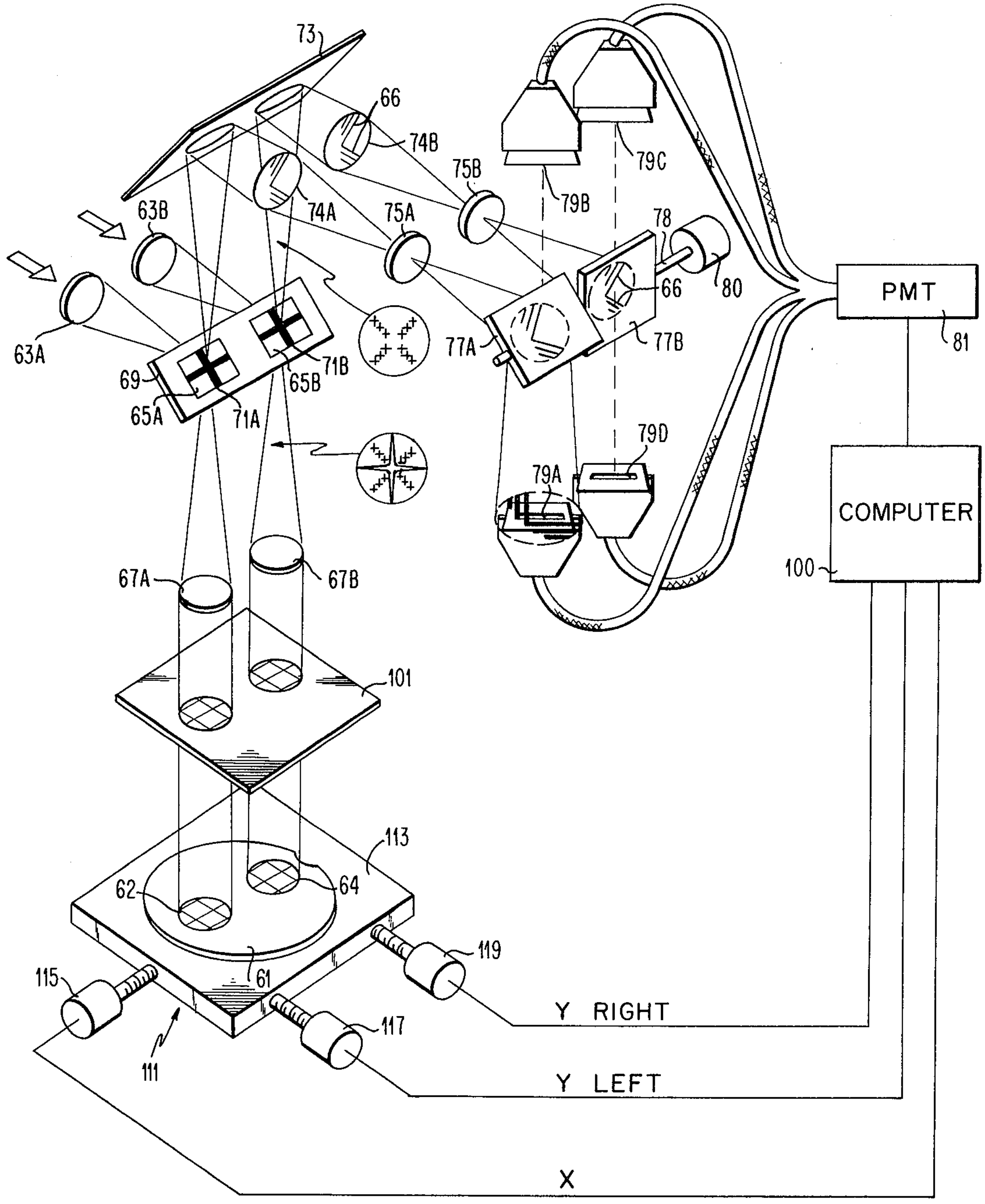
FIG. 5 is a schematic view of an embodiment of the system of the invention.

An embodiment of the system of the invention is schematically illustrated in FIG. 5. A workpiece, in this instance a semiconductor wafer 61, which is coated with a layer of photoresist for exposure through a pattern mask, 101, is illuminated at two points 62 and 64 by collimated light from He-Ne lasers (not shown). Other light sources could be used such as, for example, a point source with filters to pass the desired wave lengths. The light for the alignment is selected so that premature exposure of the photo-resist will not occur. The light is passed through condensing lenses 63A and 63B and reflected from combination half silvered mirror-filters 65A and 65B through objective lenses 67A and 67B and reflected from the surface of wafer 61 back through lenses 67A and 67B which image a Fraunhofer diffraction pattern at their back focal or frequency plane 69 where half silvered mirror filters 65A and 65B are located. The opaque areas 71A and 71B on filters 65A and 65B block all of the X-Y lines from the device patterns and pass substantially only the image of the lines 66 from the alignment pattern. The filtered images are reflected from mirror 73 to form magnified spatial images of lines 66 at 74A and 74B which are further magnified by lenses 75A and 75B and reflected from first surface mirrors 77A and 77B which are mounted on shaft 78 which is rotated by motor 80. Together, lenses 67A and 67B and 75A and 75B form the elements of two compound microscopes. The images of the lines are scanned across slits 79A, B, C, D by rotating mirrors 77A and 77B. Each slit is located parallel to the lines of the pattern which it is scanning to provide for maximum sensitivity. Fiber bundles oriented parallel to the sensed lines are used to transport the images to a single sensor in this case a photomultiplier tube. Other sensors can be used, for example, a photodiode. By employing time sharing this reduces the number of sensors required.

Photomultiplier tube 81 produces signals when the image of a line crosses the respective slits. In this case alignment patterns which each have two groups of three parallel lines with different spacing as illustrated in FIG. 3 are employed to generate each group of signals so that the correct time of line crossing is determined by signal frequency changes detected by the computer 100. The reference time zero is repeatably determined by an optical encoder (not shown) on shaft 78 which starts counters (not shown) counting from zero at the same point on each rotation of shaft 78. The times are recorded and stored in computer 100. The position of the wafer 61 is then calculated and stored as previously shown and explained in FIG. 1. The same process is repeated for the mask 101 which is positioned above wafer 61 in a suitable holder (not shown) and held stationary. The wafer 61 is then moved so that the signals generated by the wafer agree with those of the mask 101 (see FIGS. 2A–2C). Conventional indexing tables can be employed to position the wafer 61 such as the type which is described in, for example, U.S. Pat. No. 3,555,916. In the embodiment shown, an X, Y right, Y left table 111 is employed. The table comprises a platen 113 which is mounted for rotation about two points by roller bearings (not shown). Servo motors 115, 117, 119 which are controlled by computer 100 incrementally move wafer 61 until the signals generated by the alignment lines 66 agree, within selected tolerances, to those from the mask 101 (FIGS. 2A–2C). The resist layer on the wafer 61 is then exposed through the mask 101 in a conventional manner after either moving any interfering portion of the alignment optics to one side or moving the aligned mask and wafer, without changing their relative position, to an exposure station.

Figure 6:
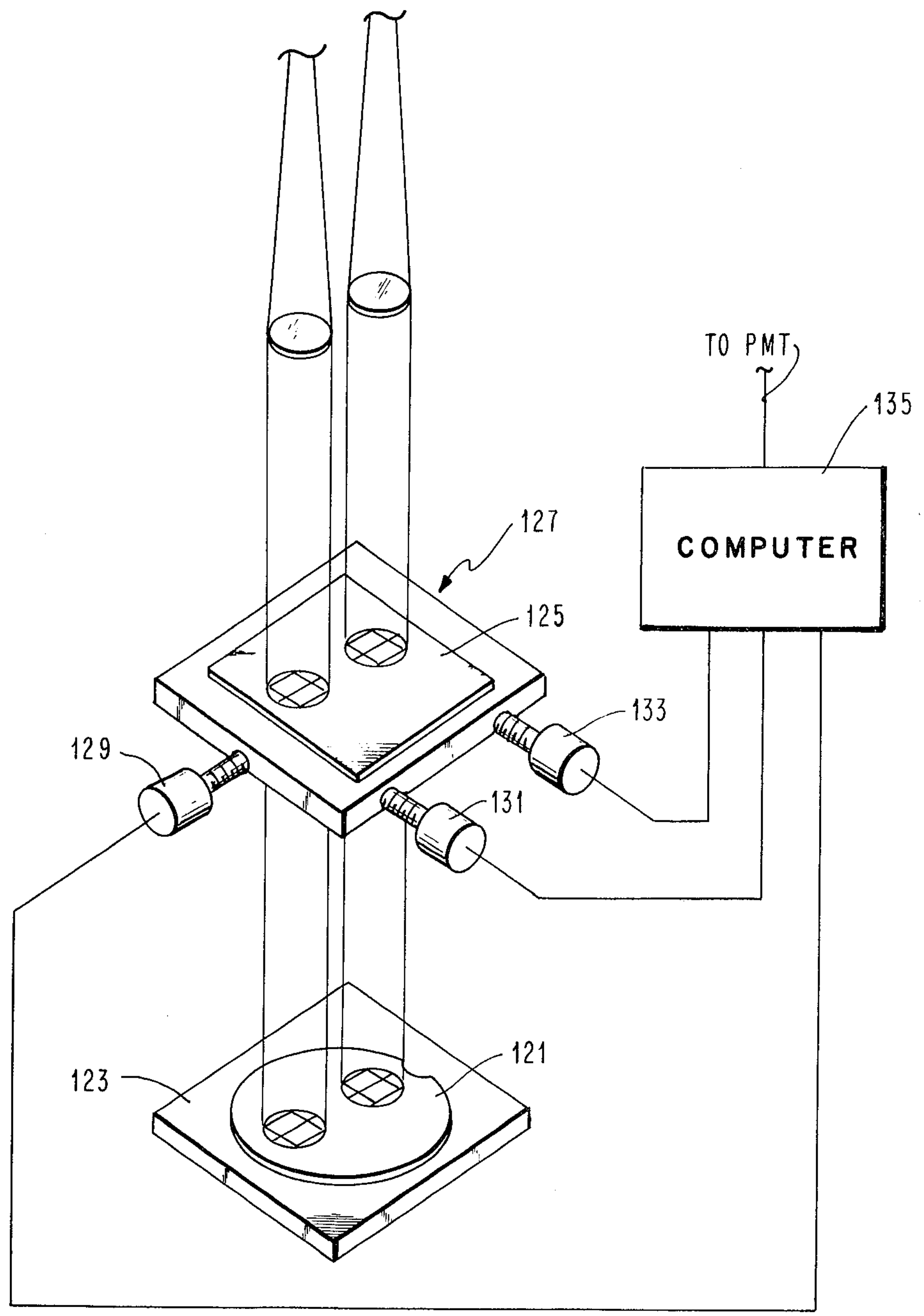
FIG. 6 is a schematic diagram of the embodiment of the system of the invention wherein the mask is moved and the wafer remains stationary.

FIG. 6 illustrates an embodiment of the invention in which wafer 121 on plate 123 remains stationary during the fine alignment process and mask 125, mounted on frame 127 is moved by servo motors 129, 131, and 133 which are controlled by a computer 135. The remainder of the alignment system is the same as is shown in FIG. 5.

It should be understood that although the embodiment described concerns for purposes of illustration the alignment of silicon material and a mask, the method and apparatus of the invention can be employed in any field where the fine alignment of objects must be accomplished.

While the invention has been particularly shown and described with reference to preferred embodiments thereof, it will be understood by those skilled in the art that various changes in form and details may be made therein without departing from the spirit and scope of the invention.

What is claimed is:

1. A method of aligning objects comprising:

providing corresponding alignment patterns in at least two spaced regions on the objects, each of said patterns comprising at least one pair of non-parallel lines, scanning the images of said lines for each region in a straight line in a single direction, sensing the points where the scanning path intersects each line so as to produce signals indicative of the position of said objects with respect to one another, such that the Y coordinate position of the intersection point of each pair of lines is determinable from the average of the times from an arbitrary starting time at which the scanning path intersects each line of said pair and where the X coordinate position of the intersection point of each pair of lines is determinable from the average of the difference of the times from said starting time at which the scanning path intersects each line of said pair, and changing the position of said objects in response to said signals.

2. A system for aligning objects comprising:

corresponding alignment patterns in at least two spaced regions on the objects, each of said patterns comprising at least one pair of non-parallel lines, means for scanning the images of said lines for each region in a straight line in a single direction, means for sensing the points where the scanning path intersects each line so as to produce signals indicative of the position of said objects with respect to one another, such that the Y coordinate position of the intersection point of each pair of lines is determinable from the average of the times from an arbitrary starting time at which the scanning path intersects each line of said pair and where the X coordinate position of the intersection point of each pair of lines is determinable from the average of the difference of the times from said starting time at which the scanning path intersects each line of said pair, and means to change the position of said objects in response to said signals.

3. A method of aligning objects comprising:

providing corresponding alignment patterns in at least two spaced regions on the objects, each of said patterns comprising at least one pair of non-parallel lines, placing and holding said objects in approximate alignment, forming diffraction patterns of said regions, spatially filtering said diffraction patterns, scanning the filtered images of said lines from each region in a single direction and sensing the points where the scanning path intersects each line so as to produce signals indicative of the X, Y cartesian coordinate position of said objects with respect to one another and changing the position of said objects in response to said signals until said objects are aligned.

4. A system for aligning objects comprising:

corresponding alignment patterns in at least two spaced regions on the objects, each of said patterns comprising at least one pair of non-parallel lines, means for placing and holding said objects in approximate alignment, means for forming diffraction patterns of said regions, means for spatially filtering said diffraction patterns, means for scanning the filtered images of said lines from each region in a single direction and means for sensing the points where the scanning path intersects each line so as to produce signals indicative of the X, Y cartesian coordinate position of said objects with respect to one another, and means for changing the position of said objects in response to said signals until said objects are aligned.

5. A system for finely aligning a workpiece with a mask comprising:

at least two corresponding spaced apart regions on said workpiece and said mask having alignment patterns each of which patterns comprising at least one pair of non-parallel lines, a light source means for directing collimated light to said regions, a pair of compound microscopes for forming magnified images of said regions, a pair of bandpass filters located at the frequency plane of the objective lenses of said microscopes to remove the light frequencies not associated with said alignment patterns, means for scanning the filtered magnified images of said lines of said alignment patterns from each region in a single direction past sensing means which generate signals characteristic of the point where the scanning path intersects each line so as to produce signals indicative of the position of said workpiece and said mask, means for placing and holding said workpiece and mask in approximate alignment said means including indexing means for changing the relative position of said workpiece and said mask and, control means to receive said signals and compute the relative position of said workpiece and said mask from said signals and cause said indexing means to change the relative position of said mask and workpiece until said received signals indicate that said mask and workpiece are finely aligned.

6. The system of claim 5 wherein said means for placing and holding said workpiece and mask in approximate alignment includes means to hold said mask in substantially a fixed position and an indexing table to hold said workpiece and change its position relative to said mask.

7. A system for finely aligning a workpiece with respect to a photomask comprising:

at least two corresponding spaced apart regions on said workpiece and said photomask having alignment patterns each of which pattern comprising at least one pair of non-parallel lines, a source of collimated light, means for directing said light to said regions, a first pair of lenses for forming Fraunhofer diffraction patterns of each region, a pair of band pass filters located at the frequency plane of said lenses to remove noise and pass substantially only the spatial frequencies of the alignment patterns, a second pair of lenses for magnifying the filtered images of the alignment pattern and imaging said patterns on a pair of mirrors which are mounted for rotation, means to rotate said mirrors at constant speed to scan said images in a single direction past sensing means to produce signals indicative of the time of each line crossing from an arbitrary time zero for each pattern, means to position and hold said workpiece and photomask in approximate optical alignment and means including indexing means for changing the relative orientation of said mask and said workpiece with respect to one another and control means for computing the relative position of said mask and said workpiece from said signals and for causing said indexing means to change the position of said mask and said workpiece until said signals indicate that said mask and said workpiece are optically aligned.

8. The system of claim 7 wherein said means to position and hold said workpiece and photomask in approximate alignment includes means to hold said photomask in substantially a fixed position and an indexing table to hold said workpiece and change its position relative to said photomask.

9. The system of claim 8 wherein said workpiece comprises a piece of semiconductor material coated with a photoresist.

10. The system of claim 7 wherein said means to position and hold said workpiece and photomask in approximate alignment includes means to hold said workpiece in substantially a fixed position and an indexing table to hold said photomask and change its position relative to said workpiece.

* * * * *